US009508458B2

(12) United States Patent
Kim

(10) Patent No.: US 9,508,458 B2
(45) Date of Patent: Nov. 29, 2016

(54) SEMICONDUCTOR MEMORY DEVICE AND OPERATING METHOD THEREOF

(71) Applicant: SK hynix Inc., Gyeonggi-do (KR)

(72) Inventor: Sung-Ho Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/836,654

(22) Filed: Aug. 26, 2015

(65) Prior Publication Data

US 2016/0293278 A1    Oct. 6, 2016

(30) Foreign Application Priority Data

Apr. 6, 2015   (KR) ..................... 10-2015-0048455

(51) Int. Cl.
| | |
|---|---|
| G11C 17/16 | (2006.01) |
| G11C 29/00 | (2006.01) |
| G11C 17/18 | (2006.01) |
| G11C 11/406 | (2006.01) |
| G11C 11/4096 | (2006.01) |
| G11C 11/4091 | (2006.01) |

(52) U.S. Cl.
CPC ........... *G11C 29/783* (2013.01); *G11C 11/406* (2013.01); *G11C 11/4091* (2013.01); *G11C 11/4096* (2013.01); *G11C 17/16* (2013.01); *G11C 17/18* (2013.01); *G11C 29/76* (2013.01)

(58) Field of Classification Search
CPC ............................. G11C 17/16; G11C 29/08
USPC ....................................... 365/96, 201
See application file for complete search history.

(56) References Cited

U.S. PATENT DOCUMENTS

| | | | | |
|---|---|---|---|---|
| 5,131,018 A | * | 7/1992 | McAdams | ....... H03K 3/356121 365/236 |
| 2009/0144583 A1 | * | 6/2009 | Bruennert | .............. G11C 29/44 714/6.32 |

FOREIGN PATENT DOCUMENTS

KR        1020050109359        11/2005

\* cited by examiner

*Primary Examiner* — Michael Tran
(74) *Attorney, Agent, or Firm* — IP & T Group LLP

(57) ABSTRACT

A semiconductor memory device may include: a plurality of first to third memory cells, each memory cell being a DRAM memory cell; a plurality of fuses suitable for storing repair information for replacing failed first memory cells with corresponding second memory cells; a normal operation unit suitable for accessing and refreshing one or more of the first and second memory cells according to the repair information during a normal mode; and a repair operation unit suitable for providing the repair information from the fuses to the third memory cells during a boot-up mode, and for providing the repair information from the third memory cells to the normal operation unit and for refreshing the third memory cells during a normal mode.

20 Claims, 4 Drawing Sheets

SEMICONDUCTOR MEMORY DEVICE AND OPERATING METHOD THEREOF

CROSS-REFERENCE TO RELATED APPLICATIONS

The present application claims priority of Korean Patent Application No. 10-2015-0048455, filed on Apr. 6, 2015, which is incorporated herein by reference in its entirety.

BACKGROUND

1. Field

Exemplary embodiments of the present invention relate to a semiconductor design technology, and more particular, to a semiconductor memory device using fuses.

2. Description of the Related Art

Semiconductor integrated circuit have multiple component circuits of the same pattern. Semiconductor integrated circuits also have redundancy circuits to replace failed component circuits.

Semiconductor memory devices have a large number of memory cells integrated in a single chip. When even one memory cells fails, its memory chip may not function normally and would need to be discarded. Since there are many memory cells in a single chip, it is common for one or more of them to be defective. Thus, in order to retain those chips having failed cells to increase yield, most semiconductor memory devices have fuse circuits and redundancy cell arrays.

Semiconductor memory devices have fuse circuits for setting initial values.

A conventional fuse circuit uses a laser fuse that resembles metal wiring, and programs the fuse by selectively cutting the metal wiring using a laser beam. That is, depending on whether the fuse is blown, the fuse circuit provides desired information to the semiconductor integrated circuit.

However, the laser fuse circuit requires continuous equipment investment due to the reduction in pitch between lines depending on the level of integration in the semiconductor integrated circuit. Furthermore, laser fuse circuits require a lot of time for fuse programming. Furthermore, the fuse array occupies a relatively large area, and the laser fuse circuit can program fuses at the wafer level, but cannot program fuses at the package level.

Recently, E-fuses have begun to replace laser fuses. E-fuses have received attention because they are capable of overcoming many of the disadvantages of laser fuses. An E-fuse resembles a transistor, and ruptures its gate dielectric layer by applying a high electric field to a gate for it to be programmed.

An E-fuse circuit may be implemented in various forms. Array E-fuse circuits, which as fuse cells arranged in an array (hereafter, referred to as a fuse array), are widely used. During initialization or power-up operations of a semiconductor integrated circuit, data programmed in the fuse array is read and latched for later use. The operation of latching the programmed data of the fuse array may be referred to as a boot-up operation. The boot-up operation shortens the time for accessing the data of the fuse array.

As the integration of semiconductor integrated circuits increases, the amount of data stored in the fuse array also increases. Thus, both the area occupied by the fuse array and the area occupied by latches has increased significantly.

Latches for latching data of the fuse array is generally accomplished using SRAM, which maintains the logic level of data stored therein using CMOS transistors. However, as the integration increases to store more data, the soft error rate (SER) also increases. The SER is the probability of soft errors, where SRAM data is lost, due to neutrons.

SUMMARY

Various embodiments are directed to a semiconductor memory device which is capable of maintaining high operating speeds while occupying less chip area in place of a latch to temporarily store data fuse data, and includes a storage circuit capable of stably storing data of a fuse array.

In an embodiment, a semiconductor memory device may include: a plurality of first to third memory cells, each memory cell being a DRAM memory cell; a plurality of fuses suitable for storing repair information for replacing failed ones among the first memory cells to corresponding ones among the second memory cells; a normal operation unit suitable for accessing and refreshing one or more of the first and second memory cells according to the repair information during a normal mode; and a repair operation unit suitable for providing the repair information from the fuses to the third memory cells during a boot-up mode, and for providing the repair information from the third memory cells to the normal operation unit and for refreshing the third memory cells during a normal mode.

In an embodiment, there is provided an operating method of a semiconductor memory device which includes a plurality of first to third memory cells, each memory cell being a DRAM memory cell, and a plurality of fuses storing repair information for replacing failed ones among the first memory cells to corresponding ones among the second memory cells, the operating method comprising: loading the repair information from the fuses to the third memory cells during a boot-up mode; accessing and refreshing the third memory cells during a normal mode; and accessing and refreshing one or more of the first and second memory cells according to the repair information of the third memory cells during the normal mode.

DETAILED DESCRIPTION

Figure 1:
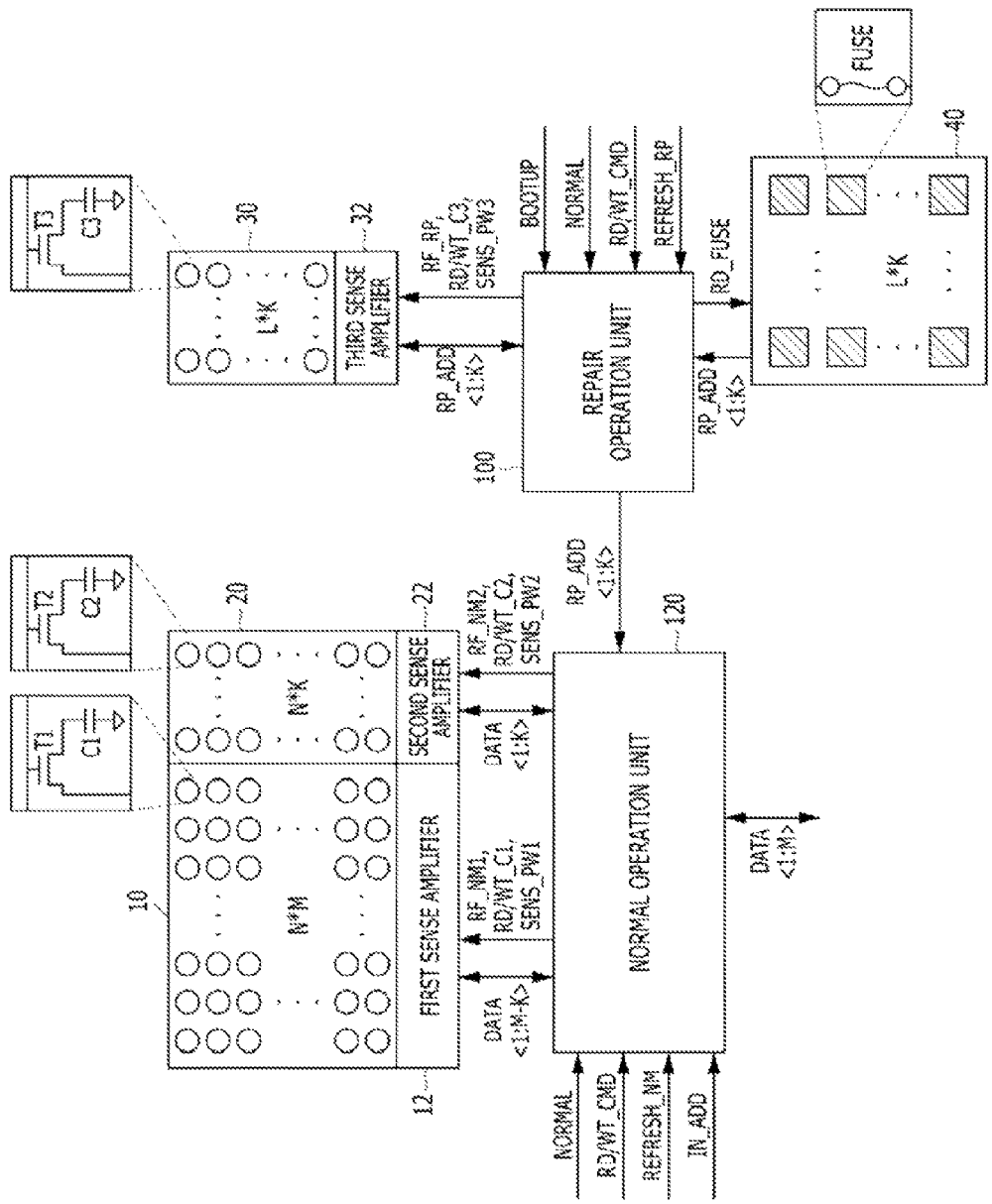
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

FIG. 1 is a block diagram illustrating a semiconductor memory device in accordance with an embodiment of the present invention.

Referring to FIG. 1, the semiconductor memory device in accordance with the embodiment of the present invention may include a plurality of first memory cells 10, a plurality of second memory cells 20, a plurality of third memory cells 30, a plurality of fuses 40, a repair operation unit 100, and a normal operation unit 120. The semiconductor memory device may further include a first sense amplifier 12, a second sense amplifier 22, and a third sense amplifier 32.

Each of the first memory cells 10 may be a dynamic random access memory (DRAM) cell.

Each of the second memory cells 20 may be a DRAM cell.

Each of the third memory cells 30 may be a DRAM cell.

Each of the fuses 40 may be an E-fuse, and has repair information RP_ADD<1:K> stored through rupture the process for replacing defective first memory cells 10 with corresponding second memory cells 20.

The plurality of first memory cells 10 may have M number of first cell groups, each of which includes N number of memory cells. The plurality of second memory cells 20 may have K number of second cell groups each of which includes N number of memory cells. That is, each of the M number of the first cell groups and the K number of the second cell groups may include N number of memory cells. Thus, among the M number of first cell groups, up to K number of the first cell groups may be repaired by the K number of second cell groups, respectively.

The plurality of third memory cells 30 may temporarily store up to K number of repair addresses RP_ADD<1:K> indicating up to K number of the first cell groups including failed memory cells among the plurality of first memory cells 10. Thus, as the plurality of second memory cells 20 have K number of the second cell groups, the plurality of third memory cells 30 may have K number of third cell groups.

As an exemplary embodiment of the present invention, the plurality of first memory cells 10 may be arranged in an array of N*M dimension. The M number of first cell groups may be arranged in columns of the N*M array of the plurality of first memory cells 10. Each of the M number of first cell groups may have the N number of memory cells in a row of the N*M array of the plurality of first memory cells 10. The plurality of second memory cells 20 may be arranged in an array of N*K dimension. The K number of the second cell groups may be arranged in columns of the N*K array of the plurality of second memory cells 20. Each of the K number of the second cell groups may have N number of memory cells in a row of the N*K array of the plurality of second memory cells 20.

The plurality of second memory cells 20 may replace the plurality of first memory cells 10 by units of single columns.

For example, when the first memory cell positioned at the third row and the fifth column is determined as failed in the N*M array of the plurality of first memory cells 10, the N number of the first memory cells of the fifth column may be replaced by the N number of the second memory cells of the first column in the N*K array of the plurality of second memory cells 20. Similarly, when the first memory cell positioned at the seventh row and the 23rd column is determined as failed in the N*M array of the plurality of first memory cells 10, the N number of the first memory cells arranged in the 23rd column may be replaced by the N number of the second memory cells arranged in the second column in the N*K array of the plurality of second memory cells 20.

When the plurality of second memory cells 20 are arranged in the N*K array, the plurality of third memory cells 30 may be arranged in an array of L*K dimension. The K number of the third cell groups may be arranged in columns of the L*K array of the plurality of third memory cells 30. The K number of the third cell groups may store repair addresses RP_ADD<1:K> each having a size of L bits, respectively.

The plurality of fuses 40 may have K number of the repair addresses RP_ADD<1:K> indicating the K number of the first cell groups including failed memory cells among the plurality of first memory cells 10. The plurality of fuses 40 and the plurality of third memory cells 30 may have the same dimension. The plurality of fuses 40 may be arranged in an array of L*K dimension.

As another example of the exemplary embodiment of the present invention, the plurality of first memory cells 10 may be arranged in an array of M*N dimension. The M number of the first cell groups may be arranged in rows of the M*N array of the plurality of first memory cells 10. Each of the M number of the first cell groups may have N number of memory cells in a column of the M*N array of the plurality of first memory cells 10. The plurality of second memory cells 20 may be arranged in an array of K*N dimension. The K number of the second cell groups may be arranged in rows of the K*N array of the plurality of second memory cells 20. Each of the K number of the second cell groups may have N number of memory cells in a column of the K*N array of the plurality of second memory cells 20.

The plurality of second memory cells 20 may replace the plurality of first memory cells 10 by units of rows.

For example, when the first memory cell positioned at the third row and the fifth column is determined as failed in the M*N array of the plurality of first memory cells 10, the N number of the first memory cells of the third row may be replaced by the N number of the second memory cells of the first row in the K*N array of the plurality of second memory cells 20. Similarly, when the first memory cell positioned at the seventh row and the 23rd column is determined as failed in the M*N array of the plurality of first memory cells 10, the N number of the first memory cells arranged in the seventh row may be replaced by the N number of the second memory cells arranged in the second row in the K*N array of the plurality of second memory cells 20.

When the plurality of second memory cells 20 are arranged in the K*N array, the plurality of third memory cells 30 may be arranged in an array of K*L dimension. The K number of the third cell groups may be arranged in rows of the K*L array of the plurality of third memory cells 30. The K number of the third cell groups may store repair addresses RP_ADD<1:K> each having the size of L bits, respectively.

The plurality of fuses 40 may have the K number of the repair addresses RP_ADD<1:K> indicating the K number of the first cell groups including failed memory cells among the plurality of first memory cells 10. The plurality of fuses 40 and the plurality of third memory cells 30 may have the same dimension. The plurality of fuses 40 may be arranged in an array of K*L dimension.

For reference, each of M, N, K, and L represents a natural number greater than 1. Since a part of the first memory cells 10 is replaced by corresponding ones of the plurality of second memory cells 20, M may indicate a natural number greater than K.

The normal operation unit 120 may read/write data DATA<1:M−K> from the plurality of first memory cells 10 or data DATA<1:K> from the plurality of second memory cells 20 based on the repair information RP_ADD<1:K> read from the plurality of third memory cells 30 through the repair operation unit 100 during a normal mode when a normal mode signal NORMAL is enabled, or refresh the plurality of first or second memory cells 10 or 20 with second refresh period.

The repair operation unit 100 may read the repair information RP_ADD<1:K> from the plurality of fuses 40 through a read command RD_FUSE during a boot-up mode when a boot-up signal BOOTUP is enabled, and write the read repair information RP_ADD<1:K> to the plurality of memory cells 30 through a write command WT_C3. Furthermore, the repair operation unit 100 may read the repair information RD_ADD<1:K> from the plurality of third memory cells 30 through a read command RD_C3 during the normal mode, or refresh the plurality of third memory cells 30 with first refresh period through a refresh command RF_RP.

Besides the read/write operation of the repair information RP_ADD<1:K>, the repair operation unit 100 may refresh the plurality of third memory cells 30 since each of the third memory cells 30 is the DRAM cell.

When the normal operation unit 120 reads/writes data DATA<1:M-K> from/to the plurality of first memory cells 10 or refreshes the plurality of first memory cells 10, the first sense amplifier 12 may sense and amplify the plurality of first memory cells 10, respectively.

When the normal operation unit 120 reads/writes data DATA<1:M-K> from/to the plurality of second memory cells 20 or refreshes the plurality of second memory cells 20, the second sense amplifier 22 may sense and amplify the plurality of second memory cells 20, respectively.

When the repair operation unit 100 reads/writes the repair addresses RP_ADD<1:K> from/to the plurality of third memory cells 30 or refreshes the plurality of third memory cells 30, the third sense amplifier 32 may sense and amplify the plurality of third memory cells 30, respectively.

While the normal operation unit 120 refreshes the plurality of first or second memory cells 10 or 20 with second refresh period, the repair operation unit 100 may refresh the plurality of third memory cells 30 with first refresh period. That is, the first and second refresh periods are different from each other.

This is because the size of capacitors C1 and C2 included in each of the first memory cells 10 and each of the second memory cells 20 is different from the size of capacitor C3 included in each of the third memory cells 30. The capacitor C3 may have greater capacitance than each of the capacitors C1 and C2. The reason for this will be described below in detail with reference to FIGS. 2 to 4.

Figure 2:
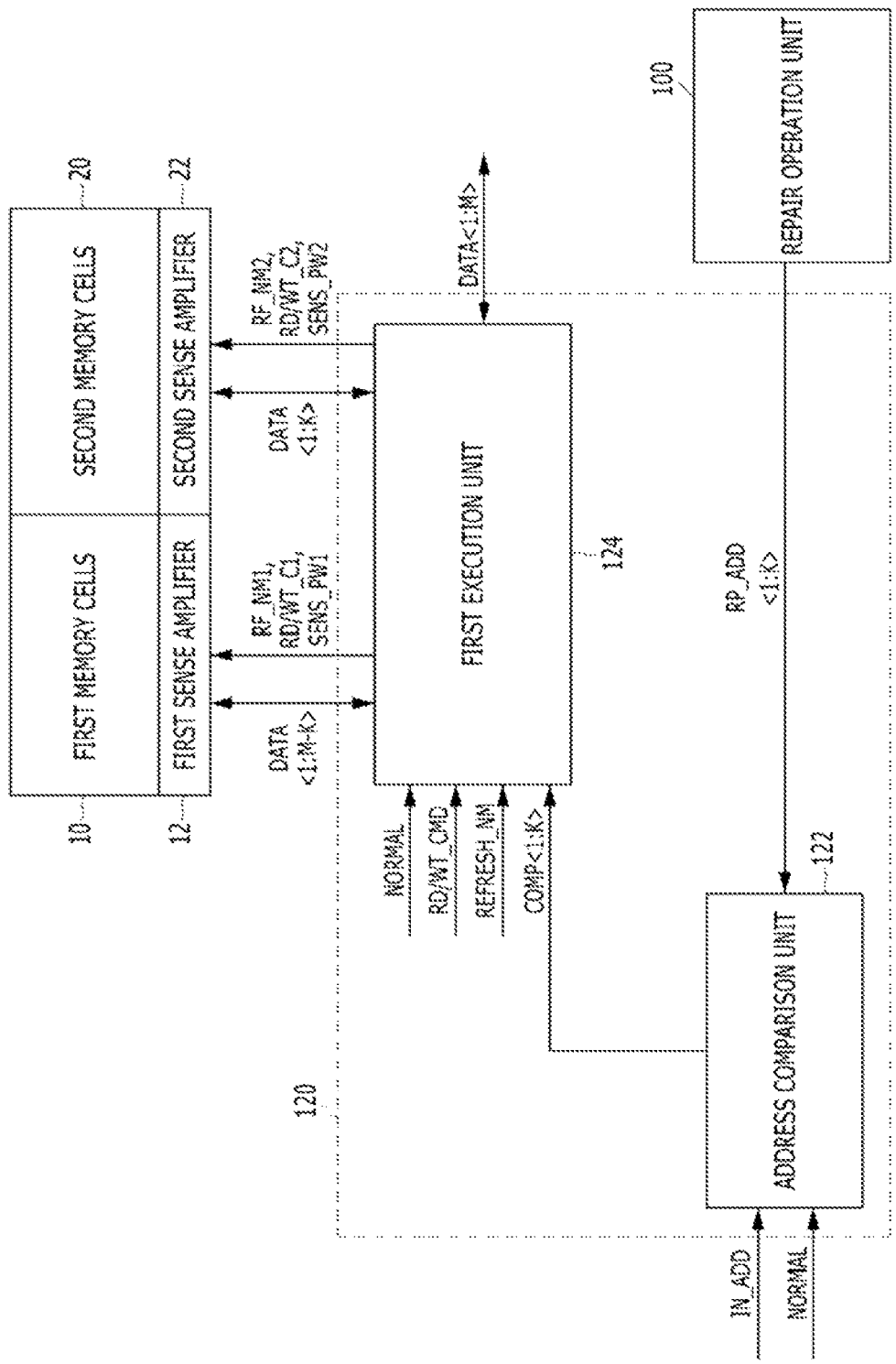
FIG. 2 is a block diagram illustrating a normal operation unit illustrated in FIG. 1.

FIG. 2 is a block diagram illustrating the normal operation unit 120 illustrated in FIG. 1.

Referring to FIG. 2, the normal operation unit 120 may include an address comparison unit 122 and a first execution unit 124.

The address comparison unit 122 may compare an input address IN_ADD with the K number of the repair addresses RP_ADD<1:K> during the normal mode.

The first execution unit 124 may read/write data DATA<1:M-K> from/to the plurality of first memory cells 10 or data DATA<1:K> from/to the plurality of second memory cells 20 in response to a read/write command RD/WT_CMD and output signals COMP<1:K> of the address comparison unit 122 during the normal mode. Furthermore, the first execution unit 124 may refresh the plurality of first or second memory cells 10 or 20 in response to a refresh normal command REFRESH_NM inputted with second refresh period and the output signals COMP<1:K> of the address comparison unit 122 during the normal mode.

Specifically, the address comparison unit 122 may determine whether a memory cell indicated by the input address IN_ADD, which is applied with the read/write command RD/WT_CMD, is normal or failed based on the comparison between the input address IN_ADD and the repair addresses RP_ADD<1:K>.

The K number of the repair addresses RP_ADD<1:K> applied from the repair operation unit 100 may represent the K number of the first cell groups including failed memory cells, respectively. The address comparison unit 122 may compare the input address IN_ADD with the K number of the repair addresses RP_ADD<1:K>, and determine whether the memory cell of the plurality of first memory cells 10 indicated by the input address IN_ADD is normal or failed.

For example, when supposing that the third repair address RP_ADD<3> among the K number of the repair addresses RP_ADD<1:K> has the same value as the input address IN_ADD, the third signal COMP<3> outputted from the address comparison unit 122 may have a different logic state from the other output signals COMP<1:K>. Thus, the first execution unit 124 may recognize that the memory cell of the plurality of first memory cells 10 indicated by the input address IN_ADD is failed and thus replaced by the corresponding memory cell included in the plurality of second memory cells 20.

In this case, the first execution unit 124 may read/write data DATA<1:K> from/to the plurality of second memory cells 20 in response to the read/write command RD/WT_CMD during the normal mode. Furthermore, the first execution unit 124 may refresh the plurality of second memory cells 20 with second refresh period in response to the refresh normal command REFRESH_NM during the normal mode.

Supposing that all of the K number of repair addresses RP_ADD<1:K> do not have the same value as the input address IN_ADD, all of the output signals COMP<1:K> of the address comparison unit 122 may have the same logic state. Thus, the first execution unit 124 may recognize that the memory cell of the plurality of first memory cells 10 indicated by the input address IN_ADD is normal.

In this case, the first execution unit 124 may read/write data DATA<1:M-K> from/to the plurality of first memory cells 10 in response to the read/write command RD/WT_CMD during the normal mode. Furthermore, the first execution unit 124 may refresh the plurality of first memory cells 10 with second period in response to the refresh normal command REFRESH_NM during the normal mode.

Figure 3:
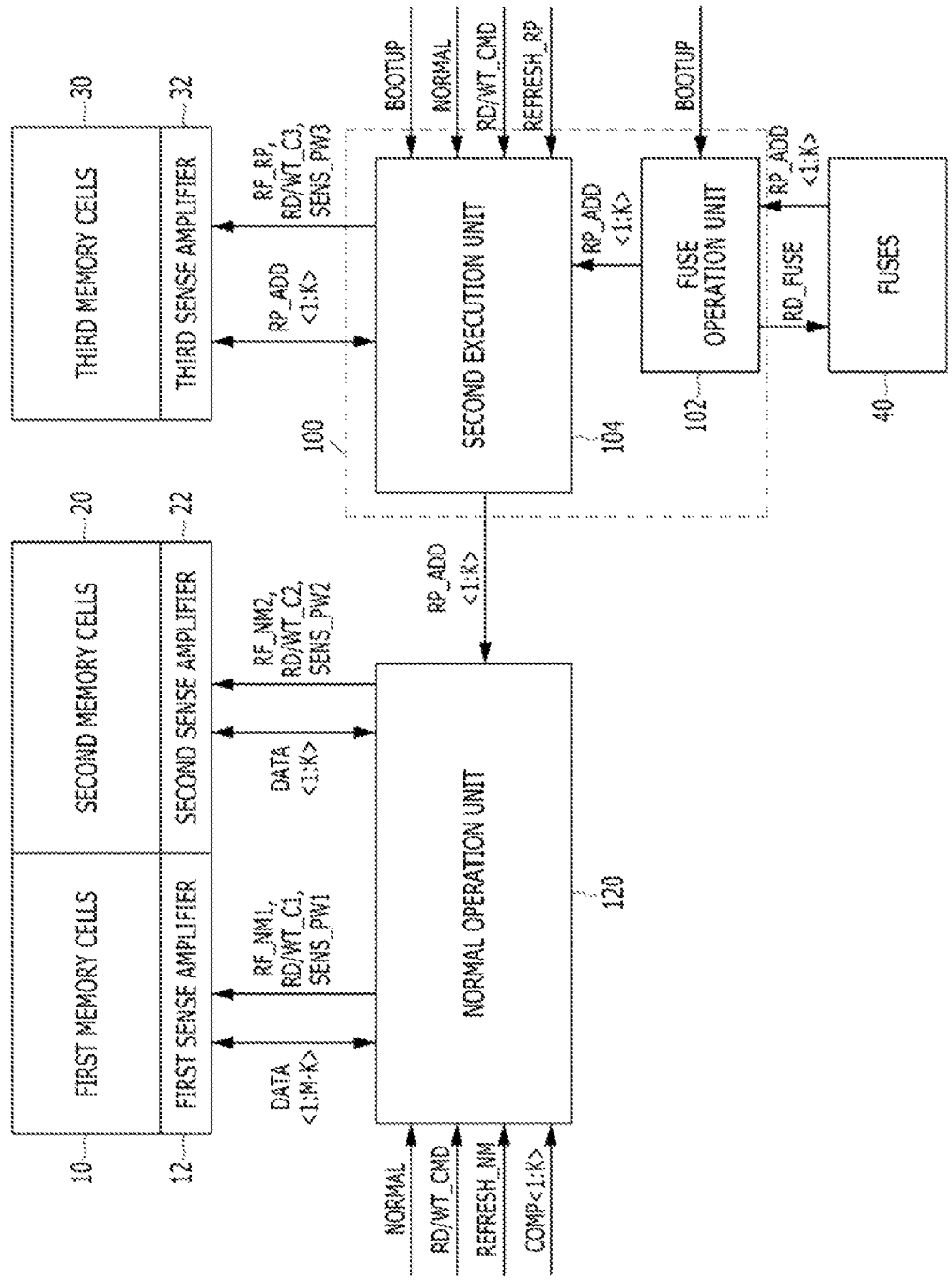
FIG. 3 is a block diagram illustrating a repair operation unit illustrated in FIG. 1.

FIG. 3 is a block diagram illustrating the repair operation unit 100 illustrated in FIG. 1.

Referring to FIG. 3, the repair operation unit 100 may include a fuse operation unit 102 and a second execution unit 104.

The fuse operation unit 102 may read the K number of repair addresses RP_ADD<1:K> from the plurality of fuses 40 during the boot-up mode.

The second execution unit 104 may write the K number of repair addresses RP_ADD<1:K>, which are provided from the fuse operation unit 102, to the plurality of third memory cells 30 during the boot-up mode. Furthermore, the second execution unit 104 may read the K number of the repair addresses RP_ADD<1:K> from the plurality of third memory cells 30 in response to the read/write command RD/WT_CMD, and transmit the read K number of the repair addresses RP_ADD<1:K> to the address comparison unit 122 during the normal mode. Furthermore, the second execution unit 104 may refresh the plurality of third memory cells 30 with first refresh period in response to the refresh repair command REFRESH_RP during the normal mode.

Specifically, during the boot-up mode, the fuse operation unit 102 may read the K number of the repair addresses RP_ADD<1:K> from the plurality of fuses 40. In this way, the K number of repair addresses RP_ADD<1:K> provided from the plurality of fuses 40 by the fuse operation unit 102 may be immediately written to the plurality of third memory cells 30 by the second execution unit 104.

Furthermore, the K number of repair addresses RP_ADD<1:K>, which are stored in the third memory cells 30 during the boot-up mode, may be transmitted from the plurality of third memory cells 30 to the normal operation unit 120 in response to the read/write command RD/WT_CMD during the normal mode.

In accordance with an exemplary embodiment of the present invention, during the normal mode, the second execution unit 104 may operate before the first execution unit 124. That is, the second execution unit 104 may provide the repair addresses RP_ADD<1:K>, then the address comparison unit 122 may operate with the repair addresses RP_ADD<1:K> to output the output signals COMP<1:K>, and then the first execution unit 124 may operate with the output signals COMP<1:K>.

In order to secure reliable operation sequencing of the first and second execution units 124 and 104, the capacitor C3 in each of the third memory cells 30 may have a greater capacitance than each of the capacitors C1 and C2 in each of the first and second memory cells 10 and 20.

With the greater capacitance of capacitor C3, the K number of repair addresses RP_ADD<1:K> may be more rapidly sensed from the third memory cells 30 by the third sense amplifier 32.

For example, suppose that each of the capacitors C1 and C2 has a first capacitance, and the capacitor C3 has a second capacitance that is two time greater than the first capacitance. In this case, the third sense amplifier 32 may sense and amplify the repair addresses RP_ADD<1:K> stored in the plurality of third memory cells 30 twice as fast as the first and second sense amplifier 12 and 22, and sense and amplify the data DATA<1:M−K> and DATA<1:K> stored in the plurality of first and second memory cells 10 and 20.

Further, in order to secure reliable operation sequencing of the first and second execution units 124 and 104, the semiconductor memory device may activate the third sense amplifier 32 corresponding to the plurality of third memory cells 30 prior to activation of the first and second sense amplifiers 12 and 22 corresponding to the plurality of first and second memory cells 10 and 20.

The first execution unit 124 may control the operations of the first and second sense amplifiers 12 and 22 through first and second sense amplification voltages SENS_PW1 and SENS_PW2, respectively. The second execution unit 104 may control the operation of the third sense amplifier 32 through a third sense amplification voltage SENS_PW3. The first and second execution units 124 and 104 may start their own operations in response to the read/write command RD/WT_CMD.

Thus, in accordance with an exemplary embodiment of the present invention, in response to the read write command RD/WT_CMD, the second execution unit 104 may output the third sense amplification voltage SENS_PW3 to the third sense amplifier 32, and then the first execution unit 124 may output the first and second sense amplification voltages SENS_PW1 and SENS_PW2 to the first and second sense amplifiers 12 and 22. Accordingly, the third sense amplifier 32 may be activated prior to activation of the first and second sense amplifiers 12 and 22.

With greater capacitance in each of the third memory cells 30 and earlier activation of the third sense amplifier 32, the K number of repair addresses RP_ADD<1:K> stored in the third memory cells 30 may be inputted to the address comparison unit 122 before the first execution unit 124 starts its operation.

Due to the capacitor C3 in each of the third memory cells 30 having greater capacitance than the capacitors C1 and C2 included in each of the first memory cells 10 and each of the second memory cells 20, the second refresh period with first or second memory cells 10 or 20 are refreshed becomes shorter than the first refresh period with which the third memory cells 30 are refreshed.

Figure 4:
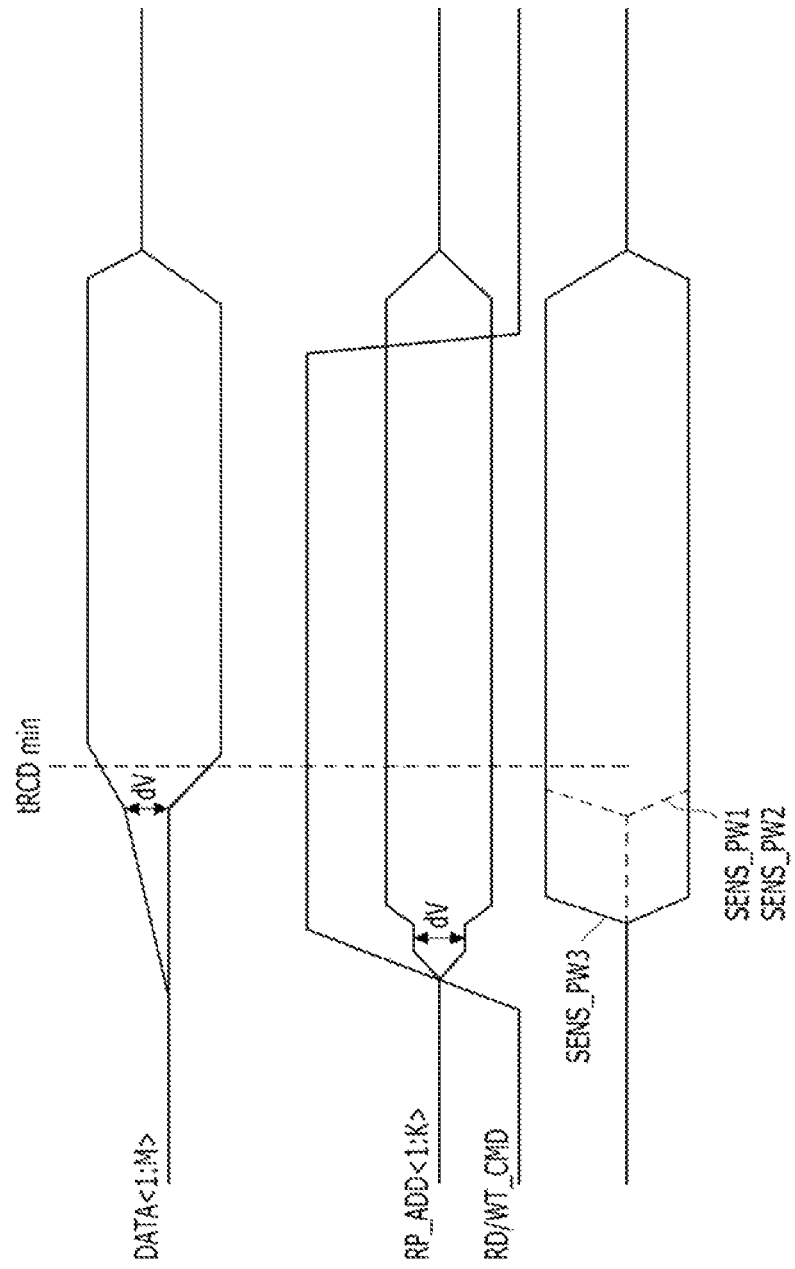
FIG. 4 is a timing diagram illustrating an operation of a semiconductor memory device illustrated in FIGS. 1 to 3.

FIG. 4 is a timing diagram illustrating an operation of the semiconductor memory device illustrated in FIGS. 1 to 3.

Referring to FIG. 4, during the normal mode, the first and second execution units 124 and 104 may start to sense and amplify the data DATA<1:M−K> and DATA<1:K> stored in the first and second memory cells 10 and 20 and the repair address RP_ADD<1:K> stored in the third memory cells 30 at the same time.

However, while the first and second sense amplifiers 12 and 22 sense the data DATA<1: M−K> and DATA<1:K> slowly, the third sense amplifier 32 may sense the repair addresses RP_ADD<1:K> rapidly.

This is because the capacitor C3 included in each of the third memory cells 30 has greater capacitance than the capacitors C1 and C2 in each of the first memory cells 10 and each of the second memory cells 20.

Due to the sensing speed differences, the sensing operation for the repair addresses RP_ADD<1:K> may be completed before the sensing operation for the data DATA<1: M−K> and DATA<1:K> are completed.

Therefore, when the sensing operation for the repair addresses RP_ADD<1:K> is completed, the second execution unit 104 may apply the third sense amplification voltage SENS_PW3 to the third sense amplifier 32, and the third sense amplifier 32 may amplify the sensed repair addresses RP_ADD<1:K>. That is, the second execution unit 104 may activate the third sense amplifier 32 prior to the activation of the first and second sense amplifiers 12 and 22.

When the sensing operation for the data DATA<1:M−K> and DATA<1:K> is completed, the first execution unit 124 may apply the first and second sense amplification voltages SENS_PW1 and SENS_PW2 to the first and second sense amplifiers 12 and 22, and the first and second sense amplifiers 12 and 22 may amplify the sensed data DATA<1:M−L> and DATA<1:K>. That is, the first execution unit 124 may activate the first and second sense amplifiers 12 and 22 after the activation of the third sense amplifier 32.

In accordance with an exemplary embodiments of the present invention, data in the fuse array may be temporarily stored in DRAM memory cells instead of the conventional SRAM. Therefore, the semiconductor memory device may continue to operate at high speed while consuming a small amount of chip area, and the data of the fuse array may be stably stored.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a plurality of first to third memory cells, each memory cell being a DRAM memory cell;
a plurality of fuses suitable for storing repair information for replacing failed first memory cells with corresponding second memory cells;
a normal operation unit suitable for accessing and refreshing one or more of the first and second memory cells according to the repair information during a normal mode; and
a repair operation unit suitable for providing the repair information from the fuses to the third memory cells during a boot-up mode, and for providing the repair information from the third memory cells to the normal operation unit and for refreshing the third memory cells during a normal mode.

2. The semiconductor memory device of claim 1,
wherein the first memory cells include M number of first cell groups, each of which includes N number of the first memory cells, and the second memory cells include K number of second cell groups, each of which includes N number of the second memory cells, and
wherein the K number of the second cell groups are provided to replace K number of failed first cell groups during a repair operation.

3. The semiconductor memory device of claim 2,
wherein when N memory cells of the first and second memory cells are arranged in each row, M first memory cells and K second memory cells are arranged in each column, and
wherein when N memory cells of the first and second memory cells are arranged in each column, M first memory cells and K second memory cells are arranged in each row.

4. The semiconductor memory device of claim 2,
wherein the fuses include K number of fuse groups, and
wherein the K number of fuse groups store the repair information for the K number of failed first cell groups, respectively.

5. The semiconductor memory device of claim 4, wherein the normal operation unit comprises:
a comparison unit suitable for comparing an input address with the repair information during the normal mode; and
a first execution unit suitable for accessing and refreshing one or more of the first and second memory cells according to a result of the comparison during the normal mode.

6. The semiconductor memory device of claim 5, wherein the repair operation unit comprises:
a fuse operation unit suitable for reading the repair information from the fuses during the boot-up mode; and
a second execution unit suitable for providing the repair information from the fuse operation unit to the third memory cells during the boot-up mode, for providing the repair information from the third memory cells to the address comparison unit during the normal mode, and for refreshing the third memory cells during the normal mode.

7. The semiconductor memory device of claim 6, further comprising:
a first sense amplifier suitable for sensing and amplifying data stored in the first memory cells under control of the first execution unit;
a second sense amplifier suitable for sensing and amplifying data stored in the second memory cells under control of the first execution unit; and
a third sense amplifier suitable for sensing and amplifying the refresh addresses stored in the third memory cells under control of the second execution unit.

8. The semiconductor memory device of claim 7, wherein the first and second execution units activate the first to third sense amplifiers so that the third sense amplifier is activated prior to activation of the first and second sense amplifiers during the normal mode.

9. The semiconductor memory device of claim 1,
wherein each of the third memory cells has greater capacitance than each of the first and second memory cells.

10. The semiconductor memory device of claim 9,
wherein the repair operation unit refreshes the third memory cells with a first refresh period,
wherein the normal operation unit refreshes one or more of the first and second memory cells with a second refresh period, and
wherein the second refresh period is shorter than the first refresh period.

11. An operating method of a semiconductor memory device which includes a plurality of first to third memory cells, each memory cell being a DRAM memory cell, and a plurality of fuses storing repair information for replacing failed first memory cells with corresponding second memory cells, the operating method comprising:
loading the repair information from the fuses to the third memory cells during a boot-up mode;
accessing and refreshing the third memory cells during a normal mode; and
accessing and refreshing one or more of the first and second memory cells according to the repair information of the third memory cells during the normal mode.

12. The operating method of claim 11,
wherein the first memory cells include M number of first cell groups, each of which includes N number of the first memory cells, and the second memory cells include K number of second cell groups, each of which includes N number of the second memory cells, and
wherein the K number of the second cell groups are provided to replace K number of failed first cell groups during a repair operation.

13. The operating method of claim 12,
wherein when the first and second memory cells have N memory cells in each row, M first memory cells and K second memory cells are in each column, and
wherein when the first and second memory cells have N memory cells in each column, M first memory cells and K second memory cells are in each row.

14. The operating method of claim 12,
wherein the fuses include K number of fuse groups, and
wherein the K number of fuse groups store the repair information for the K number of failed first cell groups.

15. The operating method of claim 14, wherein the loading of the repair information comprises:
reading the repair information from the K number of fuse groups; and
writing the read repair information to the third memory cells.

16. The operating method of claim 15, wherein the accessing of one or more of the first and second memory cells comprises:
reading the repair information from the third memory cells;

comparing the repair information with an input address; and accessing one or more of the first and second memory cells according to a result of the comparison.

17. The operating method of claim 16,
wherein the accessing of one more of the first and second memory cells includes sensing and amplifying data stored in the first and second memory cells, and
wherein the accessing of the third memory cells includes sensing and amplifying the refresh addresses stored in the third memory cells.

18. The operating method of claim 17, wherein the sensing and amplifying of the refresh addresses stored in the third memory cells is prior to the sensing and amplifying of the data stored in the first and second memory cells.

19. The operating method of claim 11,
wherein each of the third memory cells has a greater capacitance than each of the first and second memory cells.

20. The operating method of claim 19,
wherein the refreshing the third memory cells refreshes the third memory cells with a first refresh period,
wherein the refreshing of one or more of the first and second memory cells refreshes one or more of the first and second memory cells with a second refresh period, and
wherein the second refresh period is shorter than the first refresh period.

* * * * *